United States Patent
Khasnis et al.

(10) Patent No.: US 9,755,581 B2
(45) Date of Patent: Sep. 5, 2017

(54) METHOD AND SYSTEM FOR LINEARIZING A RADIO FREQUENCY POWER AMPLIFIER

(71) Applicant: SIGNALCHIP INNOVATIONS PRIVATE LIMITED, Bangalore (IN)

(72) Inventors: Himamshu Gopalakrishna Khasnis, Bangalore (IN); Anantha Melavarige Subraya, Shimoga (IN)

(*) Notice: Subject to any disclaimer, the term of this patent is extended or adjusted under 35 U.S.C. 154(b) by 0 days.

(21) Appl. No.: 15/159,659

(22) Filed: May 19, 2016

(65) Prior Publication Data
US 2016/0344350 A1 Nov. 24, 2016

(51) Int. Cl.
  H03F 1/32 (2006.01)
  H03F 3/19 (2006.01)
  H03F 3/21 (2006.01)
  H03F 1/02 (2006.01)
  H03F 1/22 (2006.01)
  H03F 1/30 (2006.01)

(52) U.S. Cl.
  CPC ............ *H03F 1/32* (2013.01); *H03F 1/0272* (2013.01); *H03F 1/22* (2013.01); *H03F 1/30* (2013.01); *H03F 3/19* (2013.01); *H03F 3/21* (2013.01); *H03F 2200/129* (2013.01); *H03F 2200/447* (2013.01); *H03F 2200/451* (2013.01); *H03F 2200/468* (2013.01)

(58) Field of Classification Search
  USPC ........................................................ 330/289
  IPC ........................................................ H03F 1/32
  See application file for complete search history.

(56) References Cited

U.S. PATENT DOCUMENTS

| | | | | |
|---|---|---|---|---|
| 5,025,248 | A * | 6/1991 | Bergeron | F25D 29/008 307/66 |
| 6,063,234 | A * | 5/2000 | Chen | G01K 7/00 156/345.27 |
| 7,804,364 | B2 * | 9/2010 | Dupuis | H01L 23/645 327/530 |
| 2009/0115520 | A1* | 5/2009 | Ripley | H03F 1/30 330/256 |
| 2011/0140772 | A1* | 6/2011 | Sengupta | H03F 1/0266 330/2 |
| 2014/0354350 | A1* | 12/2014 | Bowers | H03F 3/195 327/564 |

* cited by examiner

*Primary Examiner* — Patricia T Nguyen
(74) *Attorney, Agent, or Firm* — Stetina Brunda Garred & Brucker

(57) ABSTRACT

A method and system for linearizing a Radio Frequency Power Amplifier (RFPA) is disclosed. The method comprises calibrating signals in the RFPA to linearize the RFPA, using at least one of a first signal, a second signal, a third signal, and a fourth signal. The first signal is generated corresponding to ambient temperature. The second signal is generated corresponding to process corner of transistors in the RFPA. The third signal is generated corresponding to power supply voltage. The fourth signal is generated by feeding back output of the RFPA.

18 Claims, 6 Drawing Sheets

METHOD AND SYSTEM FOR LINEARIZING A RADIO FREQUENCY POWER AMPLIFIER

PRIORITY CLAIM

The present application claims priority to an Indian application, 2574/CHE/2015, filed on May 22, 2015, entirely of which is attached herewith.

FIELD OF THE INVENTION

The present invention relates to a field of Radio Frequency Power Amplifiers, and more specifically to a system for linearizing the Radio Frequency Power Amplifiers.

BACKGROUND

For Advanced Digital Communication Systems (ADCS) to function efficiently, Radio Frequency Power Amplifiers (RFPA) in the ADCSs have to function with linearity. It is noted that a process of causing the RFPA to function with linearity is hereafter referred to as linearizing the RFPA. An RFPA comprises one or more transistors. As a result, operational aspects of the RFPA and linearity corresponds to operating points of the one or more transistors. An operating point of a transistor is indicative of an operational characteristic of the transistor. The operating point of the transistor depends on a bias signal received at the transistor. Axiomatically, the operating points of the one or more transistors depend on one or more bias signals received at the one or more transistors.

Optimum operating points are the operating points of the one or more transistors corresponding to occurrence of linearity in functioning of the RFPA. Hence, when the operating points of the one or more transistors match the optimum operating points, the RFPA functions with linearity. Moreover, when the one or more transistors are biased to the optimum operating points, the RFPA causes reduced third order Intermodulation Distortion (IM3). In order to linearize the RFPA, typical systems adjust the one or more bias signals to bias the one or more transistors to the optimum operating points.

However, the optimum operating points vary with variations in multiple factors. For example, the optimum operating points vary with variations in ambient temperature of the RFPA. Further, rate of the variations in the optimum operating points depend on a process corner of the one or more transistors in the RFPAs. Hence, while adjusting the one or more bias signals, the process corner and the variations in the ambient temperature have to be accounted for.

The typical systems adjust the one or more bias signals to compensate for variations in the ambient temperature and consequently, maintain the one or more transistors at the optimum operating points. However, the typical systems fail to take the process corner into account while adjusting the one or more bias signals. As discussed earlier, the rate of the variation in the optimum operating points depend on the process corner. Hence, the typical systems fail to compensate the one or more bias signals accurately. As a result, the typical systems fail to maintain the one or more transistors at the optimum operating points in an event of a variation in the ambient temperature. Hence, the typical systems fail to linearize the RFPA.

SUMMARY

The problems in the typical systems are met by providing a method and system for linearizing a Radio Frequency Power Amplifier (RFPA).

An example of a method for linearizing a Radio Frequency power amplifier (RFPA) comprises calibrating signals in the RFPA using at least one of a first signal, a second signal, a third signal, and a fourth signal. The first signal is generated corresponding to ambient temperature. The second signal is generated corresponding to process corner of transistors in the RFPA. The third signal is generated corresponding to power supply voltage. The fourth signal is generated by feeding back output of the RFPA.

An example of a system for linearizing a Radio Frequency power amplifier (RFPA) comprises a circuit to calibrate signals in the RFPA in order to linearize the RFPA. The signals in the RFPA are calibrated using at least one of a first signal, a second signal, a third signal, and a fourth signal. The first signal is generated, by a temperature sensor, corresponding to ambient temperature. The second signal is generated, by a process monitor, corresponding to process corner of transistors in the RFPA. The third signal is generated, by a power supply sensing circuit, corresponding to power supply voltage. The fourth signal is generated by feeding back output of the RFPA, by the circuit.

The features and advantages described in this summary and in the following detailed description are not all-inclusive, and particularly, many additional features and advantages will be apparent to one of ordinary skill in the relevant art in view of the drawings, specification, and claims hereof. Further, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF FIGURES

In the following drawings like reference numbers are used to refer to like elements. Although the following figures depict various examples of the invention, the invention is not limited to the examples depicted in the figures.

DESCRIPTION

In the present disclosure, relational terms such as first and second, and the like, may be used to distinguish one entity from the other, without necessarily implying any actual relationship or order between such entities. The following detailed description is intended to provide example implementations to one of ordinary skill in the art, and is not intended to limit the invention to the explicit disclosure, as one or ordinary skill in the art will understand that variations can be substituted that are within the scope of the invention as described.

Embodiments of the present disclosure described herein disclose a system and method for linearizing a Radio Frequency Power Amplifier (RFPA). The system discloses a bias generator to generate bias signals and to linearize the RFPAs in spite of variations in ambient temperature and a process corner. Further, the present disclosure discloses a method of reducing dependency of linearity of the RFPA on temperature variations and process corner.

Figure 1:
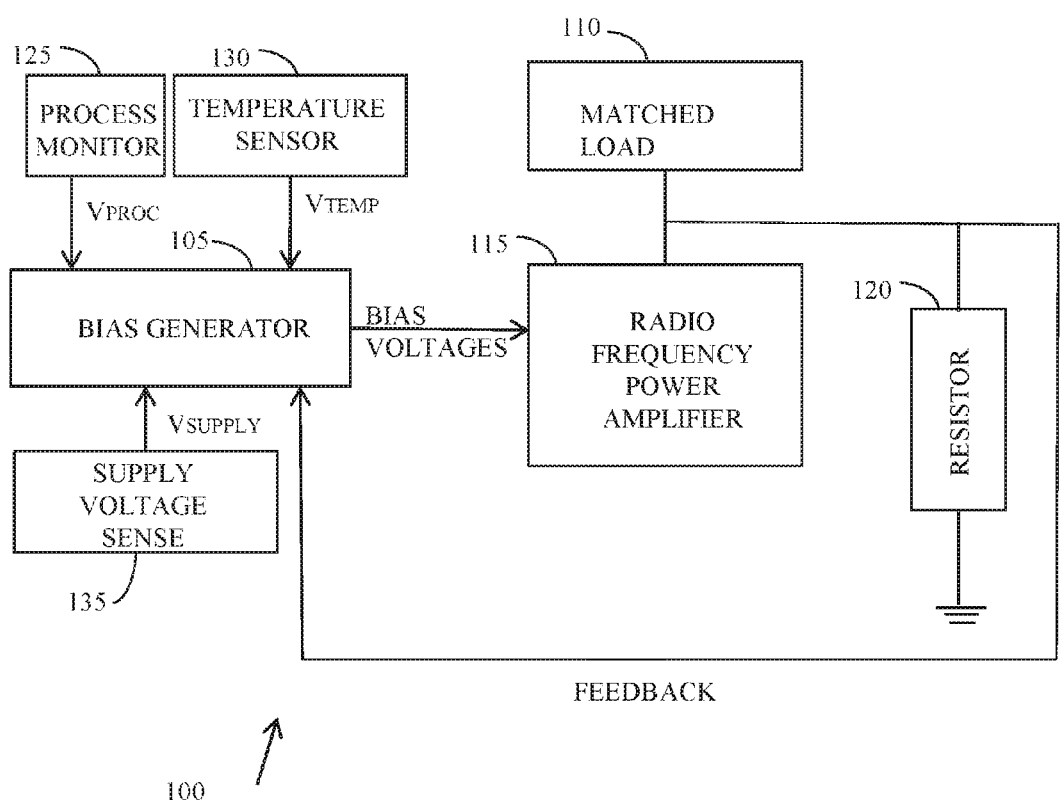
FIG. 1 is a block diagram of a system for linearizing a Radio Frequency Power Amplifier, in accordance with one embodiment of the present invention.

FIG. 1 is a block diagram of a system 100 for linearizing a Radio Frequency Power Amplifier (RFPA) in accordance with one embodiment of the present invention. The system 100 includes a bias generator 105, a matched load 110, a radio frequency power amplifier (RFPA) 115, a resistor 120, a process monitor 125, a temperature sensor 130, and a supply voltage sense 135. The matched load 110 helps in impedance matching. The matched load 110 is at least one of a capacitive load, an inductive load, and a resistive load. Examples of the RFPA 115 include, but are not limited to a cascode power amplifier, a low noise amplifier, a pre-power amplifier, a Class A power amplifier, a Class B power amplifier, a Class AB power amplifier, a Class C power amplifier, and a Class D power amplifier. The RFPA 115 comprises one or more transistors (not shown) interconnected with each other. Examples of transistors include, but are not limited to Metal Oxide Field Effect Transistors (MOSFET), Complementary Metal Oxide Field Effect Transistors (CMOS), JFETS, finfets, mesfets, and Bipolar Junction Transistors (BJT). As RFPA 115 comprises one or more transistors, operating points of the one or more transistors determine linearity and operational aspects of the RFPA 115. Further, the operating points of the one or more transistors are determined by one or more bias signals received at the one or more transistors.

The operating points of the one or more transistors wherein the RFPA 115 exhibits linearity in operation is hereafter referred to as optimum operating points. In other words, when the operating points of the one or more transistors match the optimum operating points, the RFPA 115 functions with linearity. Moreover, when the one or more transistors are at the optimum operating points, the RFPA 115 causes reduced third order Intermodulation Distortion (IM3). In order to operate at the optimum operating points, the system 100 generates the one or more bias signals to bias the one or more transistors. However, the optimum operating points vary with variations in multiple factors. For example, the optimum operating points vary with variations in ambient temperature and supply voltage of the RFPA 115. Further, rate of the variations in the optimum operating points depend on a process corner of the one or more transistors. Hence, while adjusting the one or more bias signals, the process corner and the variations in the ambient temperature and supply voltage have to be accounted for.

In one example, the system 100 generates the one or more bias signals in the bias generator 105. At the time of generating, the system 100 takes into account the variation in the optimum operating point caused due to variation in the ambient temperature. In order to generate the one or more bias signals, at first, the bias generator 105 receives a first signal from the temperature sensor 130. Examples of the temperature sensor 130 include, but are not limited to a bandgap temperature sensor, a thermistor based circuit, and an application based integrated chip. The first signal comprises information regarding the ambient temperature. In one example, the first signal is a $V_{temp}$ signal. Further, in order to account the variation in the process corner, the bias generator 105 receives a second signal from the process monitor 125. In one example, the second signal is a $V_{proc}$ signal. In order to account for the variation in the supply voltage, the bias generator 105 receives a third signal from the supply voltage sense block 125. In one example, the third signal is a $V_{sup}$ signal. The process monitor 125 is an electronic circuit capable of detecting a process corner of the one or more transistors. The second signal comprises information regarding the process corner of the one or more transistors in the RFPA 115. The process corner can be anywhere between the two extreme process corners for which the Foundry supplies device models. The extreme process corners are usually named slow corner and fast corner, weak corner and strong corner etc.

After receiving the first signal, the second signal (i.e, the $V_{temp}$ signal and the $V_{proc}$ signal) and the third signal i.e., the supply voltage, the bias generator 105 generates the one or more bias signals. In other words, the bias generator 105 generates the one or more bias signals in accordance with the ambient temperature, the supply voltage and the process corner. Further, the bias generator 105 considers the variations occurring in the first signal, the second signal and the third signal. As a result, the bias generator 105 adjusts the one or more bias signals to circumvent variations and get to the optimum operating points. It is to be understood that the RFPA 115 may suffer from non-linearity as a result of multiple factors other than the variation in the ambient temperature. For example, the RFPA 115 may suffer non-linearity as a result of at least one of a current spike, harmonics, and intermodulation distortion. To compensate for the non-linearity resulting from the multiple factors, the system 100 has to consider a fourth signal, an output of the RFPA 115. In other words, the fourth signal is indicative of a feedback signal from the RFPA 115. In one example, the bias generator 105 senses the fourth signal from the RFPA 115. Specifically, the bias generator 105 senses the fourth signal using the resistor 120. It is to be understood that the fourth signal may have variations. After receiving the fourth signal, the fourth signal is used to calibrate at least one of the first signal, the second signal, and the third signal.

The bias signals are generated by the bias generator 105. The bias generator 105 is one of an analogue bias generator and a digital bias generator. The analogue bias generator comprises multiple analogue components. Examples of the analogue components include, but are not limited to signal adders, signal subtractors, signal multipliers, signal squarer, power amplifiers, and current mirrors. The digital bias generator uses digital components to generate the one or more bias signals. Examples of the digital components include, but are not limited to analogue to digital convertors, digital to analogue converters, logical gates, processors, and field programmable gate arrays. The digital bias generator is at least one of a processor based digital bias generator and a look-up table based digital generator.

In one exemplary illustration of the present invention, the RFPA 115 is a cascode Radio Frequency Power Amplifier (cascade RFPA). The cascade RFPA 115 comprises a cascode transistor and an input transistor. As discussed earlier, when the one or more transistors (the cascode transistor and the input transistor) function at the optimum operating points, the RFPA 115 (the cascade RFPA) functions with linearity. In order to linearize the cascade RFPA 115, the system 100 biases the cascode transistor and the input transistor to the optimum operating points. The system 100 biases the cascode transistor with a cascode bias signal ($V_{cascode}$). Further, the system 100 biases the input transistor with an input bias signal ($V_{input}$).

Figure 2:
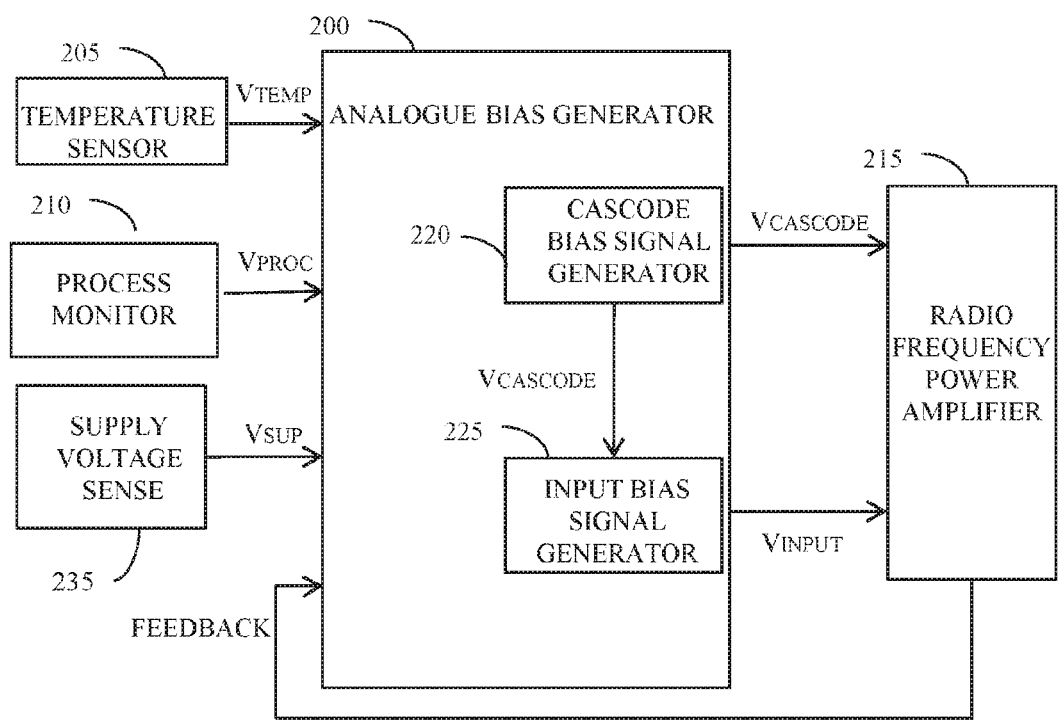
FIG. 2 is an exemplary illustration of an analogue bias generator in accordance with another embodiment of the present invention.

In one example, the bias generator 105 is the analogue bias generator. Referring to FIG. 2, an analogue bias generator 200 is explained in detail. The analogue bias generator 200 includes a temperature sensor 205, a process monitor 210, a RFPA 215, a cascode bias signal generator 220, an input bias signal generator 225, and a supply voltage sense 235. The analogue bias generator 200 generates a cascode bias signal, $V_{cascode}$ in the cascode bias signal generator 220 and an input bias signal, $V_{input}$ (described with reference to FIG. 1) in the input bias signal generator 225. To generate the $V_{cascode}$ signal and the $V_{input}$ signal, the analogue bias generator 200 receives the $V_{temp}$ signal (described with reference to FIG. 1) signal as input from the temperature sensor 205 and the $V_{proc}$ signal (described with reference to FIG. 1) as input from the process monitor 210. Input from the process monitor 210 comprises information regarding a process corner of one or more transistors. The one or more transistors comprises a cascode transistor and an input transistor (described with reference to FIG. 1) in the RFPA 215. In other words, the $V_{proc}$ signal is dependent on the process corner of the transistors. The supply voltage sense 235 senses variations in supply voltage.

The cascode bias signal generator 220 receives the $V_{temp}$ signal, the $V_{sup}$ signal and the $V_{proc}$ signal to generate the $V_{cascode}$ signal. Further, the input bias signal generator 225 receives the $V_{temp}$ signal, the $V_{sup}$ signal and the $V_{proc}$ signal to generate the $V_{input}$ signal. Further, the analogue bias generator 200 receives a fourth signal or a feedback signal from the RFPA 215. The analogue bias generator 200 calibrates the $V_{cascode}$ signal and the $V_{input}$ signal in accordance with the feedback signal. In one embodiment, the analogue bias generator 200 calibrates at least one of the $V_{cascode}$ signal, $V_{temp}$ signal, the $V_{sup}$ signal, the $V_{proc}$ signal and the $V_{input}$ signal in accordance with the feedback signal.

Figure 3:
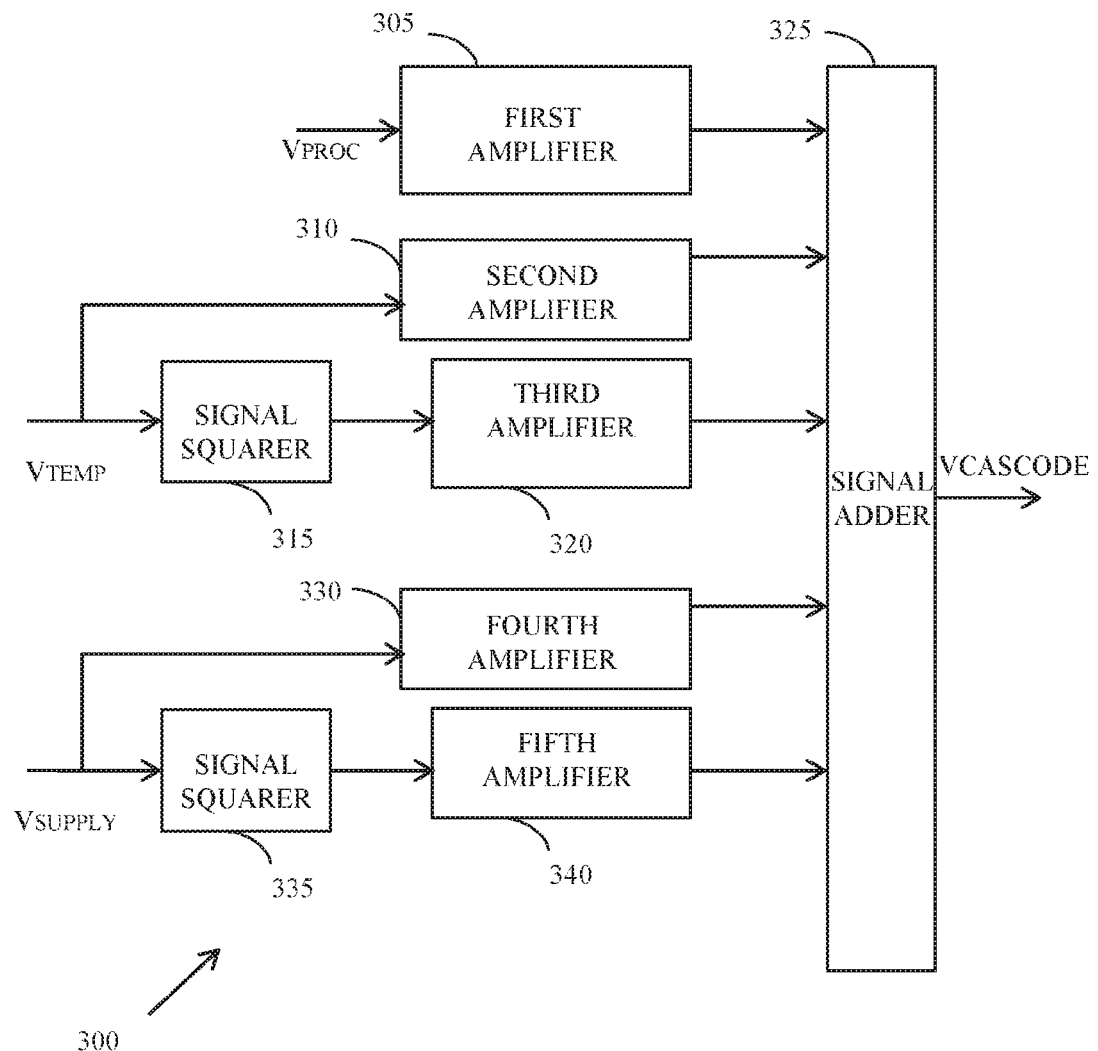
FIG. 3 is an exemplary illustration of a cascode bias signal generator in accordance with yet another embodiment of the present invention.

As discussed earlier, the cascode bias signal generator 220 generates the $V_{cascode}$ signal. With reference to FIG. 3, a cascode bias signal generator 300 is explained in detail. The cascode bias signal generator 300 generates the $V_{cascode}$ signal (described in FIG. 1) using analogue components. The cascode bias signal generator 300 comprises multiple analogue components such as a first amplifier 305, a second amplifier 310, a third amplifier 320, a first signal squarer 315, and a signal adder 325, a fourth amplifier 330, a second signal squarer 335, and a fifth amplifier 340. The first amplifier 305 is a linear amplifier with gain $\alpha_1$. The second amplifier 310 is a linear amplifier with gain $\beta_1$. The third amplifier 320 is a linear amplifier with gain $\beta_2$, The fourth amplifier 330 is a linear amplifier with gain $\beta_3$. The fifth amplifier 340 is a linear amplifier with gain $\beta_4$.

To generate the $V_{cascode}$ signal, the cascode bias signal generator 300 receives a first signal, i.e., the $V_{temp}$ signal as input from the temperature sensor 205. Further, the cascode bias signal generator receives a second signal, i.e., $V_{proc}$ signal as input from the process monitor 210 (shown in FIG. 2). The $V_{proc}$ signal is indicative of a process corner of a cascode transistor (described with reference to FIG. 1). Further, the $V_{proc}$ signal is dependent on a threshold voltage Vt, of the cascode transistor. The threshold voltage Vt is a gate to source voltage differential required to create a conducting path between a source terminal and a drain terminal in the cascode transistor. The $V_{proc}$ is obtained by the following equation:

$$V\text{proc}(t)=f(\mu^*Cox, V\text{temp}) \tag{1}$$

$\mu^*$Cox indicates a parameter dependent on the process corner. In one example, the temperature sensor 205 generates the $V_{temp}$ signal from a band gap voltage reference and additional circuitry in the temperature sensor 205. The $V_{temp}$ signal varies proportionally with the ambient temperature. The $V_{temp}$ signal is given by an equation:

$$V\text{temp}(t)=f(t) \tag{2}$$

In one embodiment, the cascode bias signal generator 300 receives a third signal, i.e., the $V_{supply}$ signal as input from the supply voltage sense 235, the $V_{cascode}$ signal is given by an equation:

$$V_{cascode}(t)=\alpha_1{}^*V\text{proc}(t)+\beta_1{}^*V\text{temp}(t)+\beta_2{}^*V\text{temp}^2(t)+\beta_3{}^*V\text{sup}(t)+\beta_4{}^*V\text{sup}^2(t) \tag{3}$$

$\alpha_1$, $\beta_1$ $\beta_2$, $\beta_3$, and $\beta_4$ are constants obtained from running the first set of simulation tests. To generate the bias signals, the cascode bias signal generator 300 combines the $V_{temp}$ signal, the $V_{proc}$ signal and the $V_{sup}$ signal in accordance with equation (3). Based on the equations one to three, values of the $V_{temp}$, $V_{proc}$, $V_{cascode}$, $V_{sup}$ and $V_{input}$ are obtained by running simulation tests by varying the ambient temperature, supply voltage and the process corner.

The cascode bias signal generator 300 generates the $\alpha_1{}^*V\text{proc}(t)$ by passing the $V_{proc}$ signal through the first amplifier 305. Further, the bias generator 105 generates the $\beta_1{}^*V\text{temp}(t)$ by passing the $V_{proc}$ signal through the second amplifier 310. Further, the bias generator 105 generates the $\beta_2{}^*V\text{temp}^2(t)$ by sending the $V_{temp}$ signal through the first signal squarer 315 and the third amplifier 320, Further, the bias generator 105 generates the $\beta_3{}^*V_{sup}(t)$ by passing the $V_{sup}$ signal through the fourth amplifier 330. Further, the bias generator 105 generates the $\beta_4{}^*V\text{sup}^2(t)$ by passing the $V_{sup}$ signal through the second signal squarer 335 and the fifth amplifier 340. Furthermore, the cascode bias signal generator 300 combines output of the first amplifier 305, the second amplifier 310, the third amplifier 320, the fourth amplifier 330, the fifth amplifier 340 in the signal adder 325 to generate the $V_{cascode}$ signal. In other words, the cascode bias signal generator 300 generates the $V_{cascode}$ signal by adding multiples of the $V_{temp}$ signal, the $V_{proc}$ signal, the $V_{sup}$ signal, the $V_{sup}{}^2$ signal and the V$temp^2$ signal.

Figure 4:
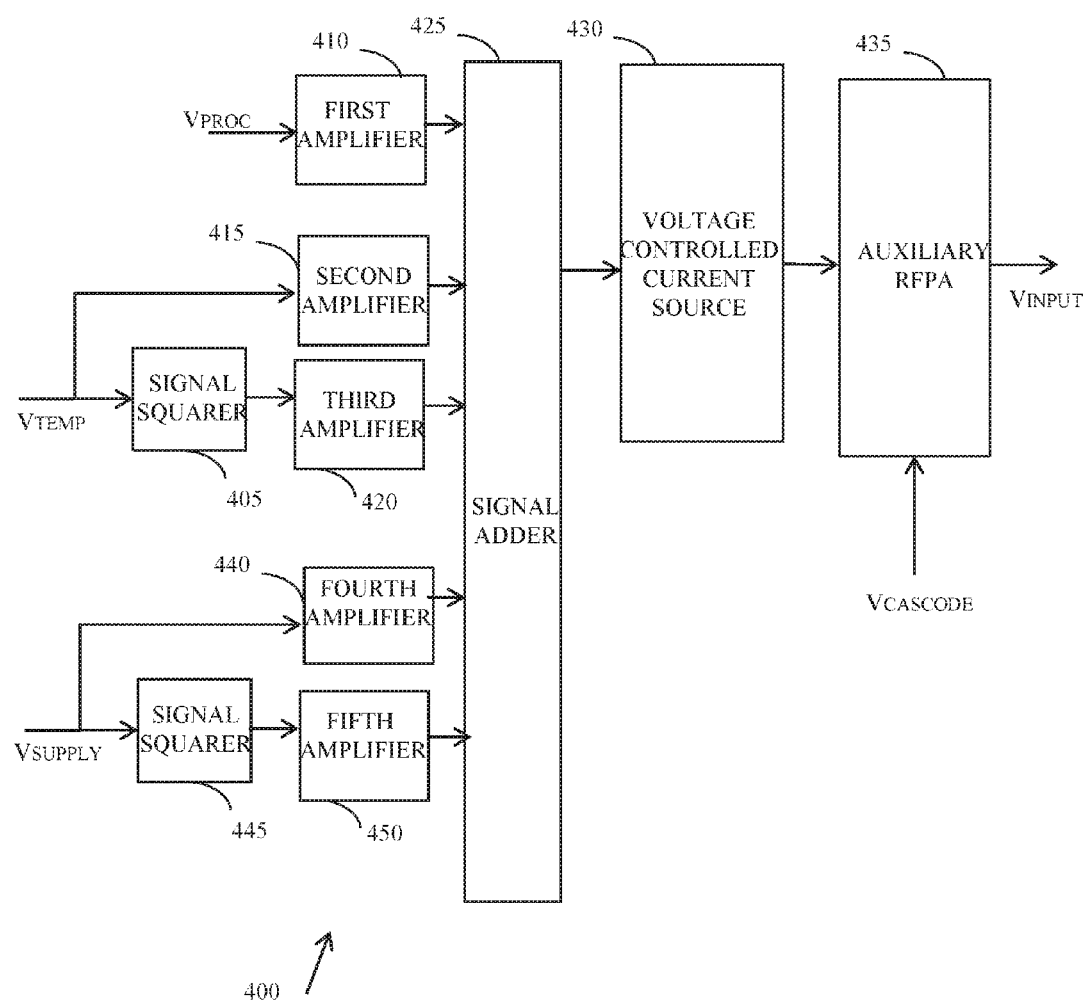
FIG. 4 is an exemplary illustration of an input bias signal generator in accordance with one embodiment of the present invention.

The analogue bias generator 200 (as shown in FIG. 2) generates the $V_{input}$ signal in the input bias signal generator 225. Referring to FIG. 4, functioning of an input bias signal generator 400 is explained in detail, in accordance with one exemplary embodiment of the present disclosure. The input bias signal generator 400 comprises an auxiliary RFPA 435 to generate the $V_{input}$ signal. The auxiliary RFPA 435 includes a pair of transistors connected to each other to replicate connections of the one or more transistors in the RFPA 115 (shown in FIG. 1). When the auxiliary RFPA 435 is biased with a bias current $I_{bias}$ and the $V_{cascode}$ signal (described with reference to FIG. 3), the auxiliary RFPA 435 generates the $V_{input}$ signal as an output. Further, the input bias signal generator 400 comprises a first signal squarer 405, a first amplifier 410, a second amplifier 415, a third amplifier 420, a signal adder 425, a Voltage Controlled Current Source (VCCS) 430, a fourth amplifier 440, a second signal squarer 445, and a fifth amplifier 450. The first amplifier 410 is a linear amplifier with gain $\alpha_2$. The second amplifier 315 is a linear amplifier with gain $\beta5$. The third amplifier 420 is a linear amplifier with gain $\beta6$. The fourth amplifier 440 is a linear amplifier with gain $\beta_7$. The fifth amplifier 450 is a linear amplifier with gain $\beta_8$. The voltage controlled current source 430 controlled by a control signal $V_{CTRL}$. As discussed earlier, the input bias signal generator 400 generates the $V_{input}$ signal by biasing the auxiliary RFPA 435 with the bias current signal $I_{bias}$ and the $V_{cascode}$ signal. In other words, the auxiliary RFPA 435 generates the $V_{input}$ based on the bias current signal $I_{bias}$ and the $V_{cascode}$ signal. The bias generator 105 generates the bias current $I_{bias}$ from the voltage controlled current source 430 controlled by the control signal $V_{CTRL}$. For example, the control signal $V_{CTRL}$ is given by an equation:

$$V_{CTRL}(t) = \alpha_2 * V\text{proc}(t) + \beta_5 * V\text{temp}(t) + \beta_6 * V\text{temp}^2(t) + \beta_7 * V\text{sup}(t) + \beta_8 * V\text{sup}^2(t) \quad (4)$$

$\alpha_2$, $\beta_5$, $\beta_6$, $\beta_7$ and $\beta_8$ are constants obtained from simulation tests. To generate the control signal $V_{CTRL}$, the input bias signal generator 400 combines the $V_{temp}$ signal and the $V_{proc}$ signal in accordance with equation (4). Further, the input bias signal generator 400 generates the $\alpha_2 * V_{proc}(t)$ by passing the $V_{proc}$ signal through the first amplifier 410. Further, the input bias signal generator 400 generates the $\beta_5 * V_{temp}(t)$ by sending the $V_{tempj}$ signal through the second amplifier 415. Further, the input bias signal generator 400 generates the $\beta_6 * V_{temp}^2(t)$ by sending the $V_{temp}$ signal through the signal squarer 405 and the third amplifier 420. Further, the input bias signal generator 400 generates the $\beta_7 * V$ sup(t) by passing the $V_{sup}$ signal through the fourth amplifier 440. Further, the input bias signal generator 400 generates the $\beta_8 * V$ sup$^2$(t) by passing the $V_{sup}$ signal through the second signal squarer 445 and the fifth amplifier 450. The first signal squarer 405 squares the $V_{temp}$ signal. Furthermore, the input bias signal generator 400 combines outputs of the first amplifier 410, the second amplifier 415, the third amplifier 420, the fourth amplifier 440, and the fifth amplifier 450 in the signal adder 425 to generate the control signal $V_{CTRL}$. In other words, the input bias signal generator 400 generates the $V_{cascode}$ signal by adding multiples of the $V_{temp}$ signal, the $V_{proc}$, signal, the signal, the $V_{sup}$ signal, the $V_{sup}^2$ signal. The input bias signal generator 400 uses the control signal $V_{CTRL}$ as input to the voltage controlled current source 430. The voltage controlled current source 430 generates the bias current signal $I_{bias}$ in accordance with the control signal $V_{CTRL}$. The bias current signal $I_{bias}$ is given by the following equation:

$$I_{bias}(t) = G(V_{CTRL}) = G(\alpha_2 * V\text{proc}(t) + \beta_5 * V\text{temp}(t) + \beta_6 * V\text{temp}^2(t) + \beta_7 * V\text{sup}(t) + \beta_8 * V\text{sup}^2(t)) \quad (5)$$

G is the transconductance of the Voltage Controlled Current Source 430. The Voltage Controlled Current Source 430 supplies the bias current signal $I_{bias}$ to the auxiliary RFPA 435. The auxiliary RFPA 435 generates the $V_{input}$ signal based on the bias current signal $I_{bias}$ and the $V_{cascode}$ signal.

Figure 5:
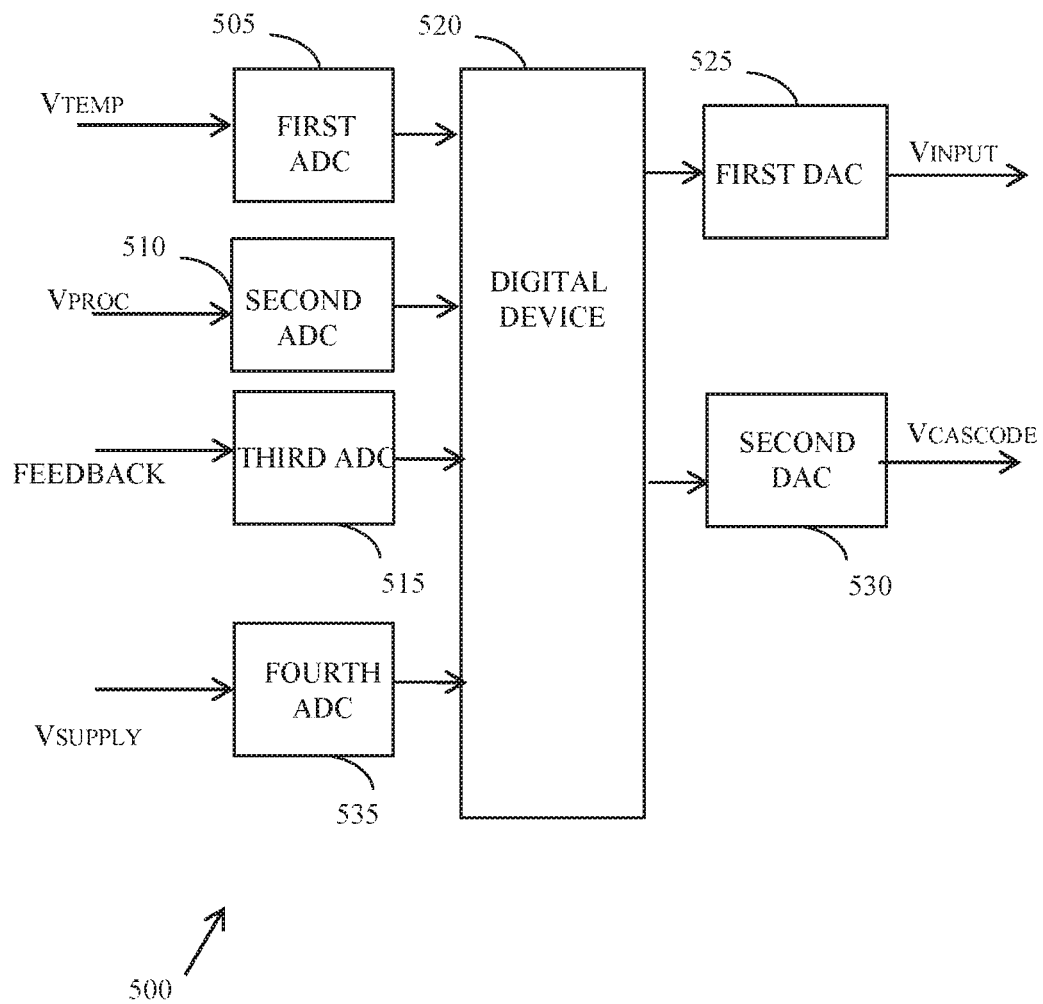
FIG. 5 is an exemplary illustration of a digital bias generator in accordance with one embodiment of the present invention.

As discussed in FIG. 1, the bias generator 105 may be a digital bias generator. Referring to FIG. 5, a digital bias generator 500 is described in detail. The digital bias generator 500 is one of a processor based digital bias generator and/or a look-up table based digital bias generator. The digital bias generator 500 comprises a plurality of analogue to digital convertors (ADC) such as a first ADC 505, a second ADC 510, a third ADC 515, a digital device 520, and two digital to analogue convertors, a first DAC 525, and a second DAC 530. Further, the digital bias generator 500 comprises a fourth ADC 535. The digital device 520 is at least one of a processor, a look up table, a field programmable gate array, and a flash memory. The digital bias generator 500 generates one or more bias signals required to bias the one or more transistors to the optimum operating points (described with reference to FIG. 1) to linearize the RFPA 115. To generate the one or more bias signals, the digital bias generator 500 receives a $V_{temp}$ signal from a temperature sensor 130, a $V_{proc}$ signal from a process monitor, and a feedback signal from the RFPA 115 (shown in FIG. 1). The first ADC 505 in the digital bias generator 500 converts the $V_{temp}$ signal into a first digital signal and supplies the first digital code to the digital device 520. The second ADC 510 converts the $V_{proc}$ signal into a second digital signal and supplies the second digital code to the digital device 520. The third ADC 515 converts the feedback signal into a third digital signal and supplies the third digital code to the digital device 520. The fourth ADC 535 converts the supply voltage signal into a fourth digital signal and supplies the fourth digital code to the digital device 520.

In one embodiment of the present invention, the digital device 520 is a processor. The digital device 520 calculates values of the one or more bias signals required to bias the one or more transistors to the optimum operating points. Further, the digital device 520 generates one or more digital bias signals based on the values calculated. In another embodiment of the present invention, the digital device 520 comprises a look-up table. The look-up table comprises values of the one or more bias signals required for multiple combinations of the $V_{temp}$ signal, the $V_{proc}$ signal, the feedback signal, and the supply voltage signal. The digital device 520 identifies the values of the one or more bias signals required and generates the one or more digital bias signals. The first DAC 525 and the second DAC 530 generate the one or more bias signals from the one or more digital bias signals.

In one embodiment of the present invention, the one or more bias signals comprises a $V_{cascode}$ signal and a $V_{input}$ signal. The digital device 520 generates a fifth digital code in accordance to the value of the $V_{input}$ signal and a sixth digital code in accordance to the value of the $V_{cascode}$ signal. The first DAC 525 generates the $V_{input}$ from the fifth digital signal. The second DAC 530 generates the $V_{cascode}$ from the sixth digital signal.

Figure 6:
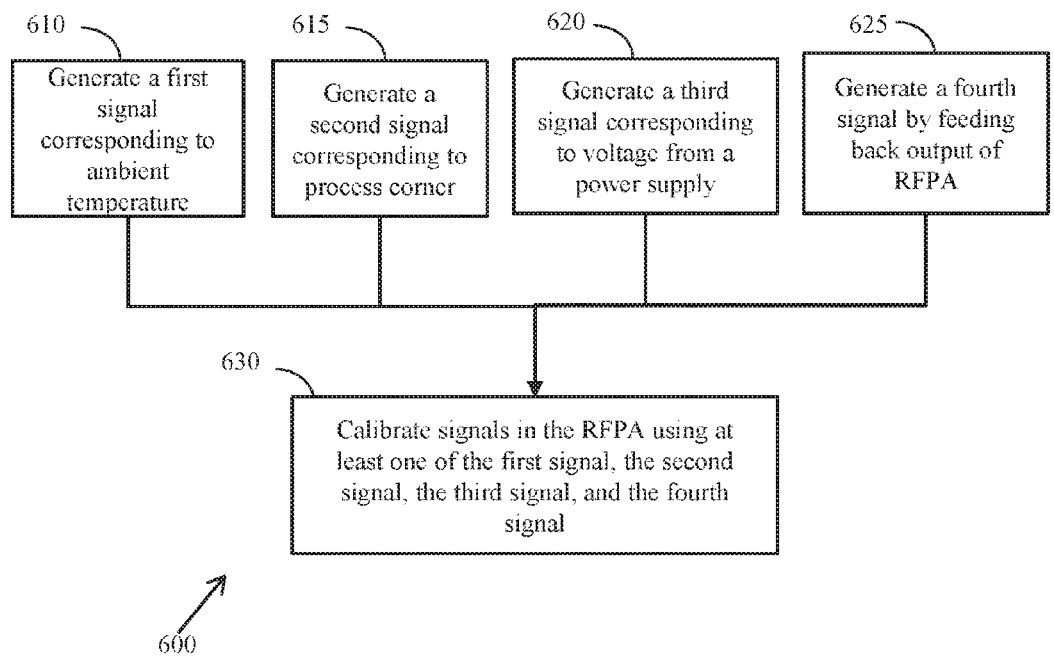
FIG. 6 is a flowchart of a method of linearizing a Radio Frequency power amplifier (RFPA) with a bias generator in accordance with one embodiment of the present invention.

FIG. 6 is a flowchart of a method 600 for linearizing a Radio Frequency power amplifier (RFPA) with a bias generator in accordance with one embodiment of the present invention. The RFPA comprises one or more transistors.

At step 610, a first signal corresponding to ambient temperature of the RFPA is generated. In one embodiment of the present invention, the first signal is generated by a temperature sensor (as described in FIG. 1). In one embodiment of the present invention, the first signal is a $V_{temp}$ signal.

At step 615, a second signal based on the process corner of transistors in the RFPA is generated. In one embodiment of the present invention, the second signal is generated by the process monitor. The second signal is a $V_{proc}$ signal.

At step 620, a third signal corresponding to power supply voltage is generated.

At step 625, a fourth signal is generated by feeding back output of the RFPA. In one embodiment of the present invention, the fourth signal is generated by the bias generator.

At step 630, signals in the RFPA are calibrated using at least one of the first signal, the second signal, the third signal, and the fourth signal.

Techniques mentioned in the present disclosure invention are further applicable to systems requiring power amplifiers with high degree of linearity in a wide gamut of temperatures and process corners.

Advantageously, the embodiments specified in the present disclosure provide a system and method of linearizing Radio Frequency Power Amplifiers (RFPA). The proposed invention increases allowed temperature range of operation of RFPAs. Further, the proposed invention makes the RFPA independent of variations in temperature and power supply voltage. Moreover, the proposed invention decreases dependency of the RFPAs on process corners.

In the preceding specification, the present disclosure and its advantages have been described with reference to the specific embodiments. However, it will be apparent to a person with ordinary skill in the art that various modifications and changes can be made, without departing from the scope of the present disclosure, as set forth in the claims below. Accordingly, the specification and figures are to be regarded as illustrative examples of the present disclosure, rather than in restrictive sense. All such possible modifications are intended to be included within the scope of present disclosure.

We claim:

1. A method of linearizing a Radio Frequency Power Amplifier (RFPA), the method comprising:
   calibrating signals in the RFPA to linearize the RFPA, using at least one of a first signal, a second signal, a third signal, and a fourth signal,
      wherein the first signal is generated corresponding to ambient temperature,
      wherein the second signal is generated corresponding to process corner of transistors in the RFPA,
      wherein the third signal is generated corresponding to power supply voltage, and
      wherein the fourth signal is generated by feeding back output of the RFPA.

2. The method as claimed in claim 1, wherein the fourth signal is used to calibrate at least one of the first signal, the second signal, and the third signal.

3. The method as claimed in claim 1, wherein the first signal, the second signal, the third signal, and the fourth signal are used to calibrate the bias signal of one or more transistors of the RFPA.

4. The method as claimed in claim 3, wherein the bias signals are generated using a bias generator, wherein the bias generator comprises one of an analogue bias generator, and a digital bias generator.

5. The method as claimed in claim 4, wherein the digital bias generator comprises one of a processor based digital bias generator or a look-up table based digital bias generator.

6. The method as claimed in claim 4, wherein the analogue bias generator generates the bias signals by:
   generating a cascode bias signal by adding multiples or polynomials of the first signal, the second signal, the third signal, and the fourth signal;
   generating a bias current using the multiples or polynomials of one of the first signal, the second signal, the third signal, and the fourth signal; and
   generating an input bias signal based on the cascode bias signal and the bias current.

7. The method as claimed in claim 5, wherein the processor based digital bias generator or the look-up table based digital bias generator generates the bias signals by:
   converting the first signal, the second signal, the third signal and the fourth signal into a first digital code, a second digital code, a third digital code, and a fourth digital code, respectively;
   calculating values for the bias signal using one of the processor based digital bias generator and the look-up table based digital bias generator, based on the first digital code, the second digital code, the third digital code, and the fourth digital code;
   generating one or more digital bias signals based on the values calculated; and
   generating the bias signals using the one or more digital bias signals.

8. A system for linearizing a Radio Frequency Power Amplifier (RFPA), the system comprising:
   a circuit to calibrate signals in the RFPA in order to linearize the RFPA, wherein the signals in the RFPA are calibrated using at least one of a first signal, a second signal, a third signal, and a fourth signal,
      wherein the first signal is generated, by a temperature sensor, corresponding to ambient temperature of the RFPA;
      wherein the second signal is generated, by a process monitor, corresponding to process corner of transistors in the RFPA,
      wherein the third signal is generated, by a power supply sensing circuit, corresponding to power supply voltage, and
      wherein the fourth signal is generated by feeding back output of the RFPA.

9. The system as claimed in claim 8, wherein the fourth signal is used to calibrate at least one of the first signal, the second signal, and the third signal.

10. The system as claimed in claim 8, wherein the first signal, the second signal, the third signal, and the fourth signal are used to calibrate bias signal of the one or more transistors of the RFPA.

11. The system as claimed in claim 10, wherein the bias signals are generated using a bias generator.

12. The system as claimed in claim 11, wherein the bias generator is one of an analogue bias generator, and a digital bias generator.

13. The system as claimed in claim 12, wherein the digital bias generator is one of a processor based digital bias generator and a look-up table based digital bias generator.

14. The system as claimed in claim 12, wherein the analogue bias generator comprises:
   a cascode bias signal generator to generate a cascode bias signal by adding multiples or polynomials of the first signal, the second signal, the third signal, and the fourth signal;
   a signal adder to generate a first bias signal by adding the multiples or polynomials of the first signal, the second signal, the third signal, and the fourth signal;
   a voltage controlled current source to generate a first bias current; and
   an auxiliary RFPA to generate a second bias signal based on the first bias current and the cascade bias signal.

15. The system as claimed in claim 13, wherein the processor based digital bias generator or the look-up table based digital bias generator comprises:
   an Analogue to Digital Converter (ADC) to convert the first signal, the second signal the third signal and the fourth signal into a first digital code, a second digital code, a third digital code, and a fourth digital code, respectively; and
   a processor operable to:
      calculate values for the bias signals based on the first digital code, the second digital code, the third digital code, and the fourth digital code; and
      generate one or more digital bias signals based on the calculation; and
   a Digital to Analogue Converter (DAC) to generate the bias signals from the one or more digital bias signals.

16. The system as claimed in claim 15, wherein the one or more digital bias signals are selected from a lookup table in the look-up table based digital bias generator based on the first digital code, the second digital code, the third digital code, and a fourth digital code.

17. The system as claimed in claim 8, wherein the temperature sensor is at least one of a bandgap temperature sensor, a thermistor based circuit, and an application based integrated chip.

18. The system as claimed in claim 8, wherein the RFPA is at least one of a cascode power amplifier, a low noise amplifier, a pre-power amplifier, a Class A power amplifier, a Class B power amplifier, a Class AB power amplifier, a Class C power amplifier, and a Class D power amplifier.

* * * * *